US007153757B2

(12) United States Patent
McCann et al.

(10) Patent No.: US 7,153,757 B2
(45) Date of Patent: Dec. 26, 2006

(54) METHOD FOR DIRECT BONDING TWO SILICON WAFERS FOR MINIMISING INTERFACIAL OXIDE AND STRESSES AT THE BOND INTERFACE, AND AN SOI STRUCTURE

(75) Inventors: Paul Damien McCann, Jordanstown (IE); William Andrew Nevin, Portadown (IE)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/651,180

(22) Filed: Aug. 29, 2003

(65) Prior Publication Data

US 2004/0087109 A1    May 6, 2004

Related U.S. Application Data

(60) Provisional application No. 60/406,735, filed on Aug. 29, 2002, provisional application No. 60/406,720, filed on Aug. 29, 2002.

(51) Int. Cl.
*H01L 21/30* (2006.01)
(52) U.S. Cl. .................................. 438/455; 438/149
(58) Field of Classification Search ................ 438/455, 438/149
See application file for complete search history.

(56) References Cited

U.S. PATENT DOCUMENTS 4,878,957 A * 11/1989 Yamaguchi et al. ....... 148/33.3

\* cited by examiner

*Primary Examiner*—Long Pham
(74) *Attorney, Agent, or Firm*—Gauthier & Connors LLP (57) ABSTRACT

A semiconductor substrate (1) comprises first and second silicon wafers (2,3) directly bonded together with interfacial oxide and interfacial stresses minimised along a bond interface (5), which is defined by bond faces (7) of the first and second wafers (2,3). Interfacial oxide is minimised by selecting the first and second wafers (2,3) to be of relatively low oxygen content, well below the limit of solid solubility of oxygen in the wafers. In order to minimise interfacial stresses, the first and second wafers are selected to have respective different crystal plane orientations. The bond faces (7) of the first and second wafers (2,3) are polished and cleaned, and are subsequently dried in a nitrogen atmosphere. Immediately upon being dried, the bond faces (7) of the first and second wafers (2,3) are abutted together and the wafers (2,3) are subjected to a preliminary anneal at a temperature of at least 400° C. for a time period of a few hours. As soon as possible after the preliminary anneal, and preferably, within forty-eight hours of the preliminary anneal, the first and second wafers (2,3) are fusion bonded at a bond anneal temperature of approximately 1,150° C. for a time period of approximately three hours. The preliminary anneal may be omitted if fusion bonding at the bond anneal temperature is carried out within approximately six hours of the wafers (2,3) being abutted together. An SOI structure (50) may subsequently be prepared from the semiconductor structure (1) which forms a substrate layer (52) supported on a handle layer (55) with a buried insulating layer (57) between the substrate layer (52) and the handle layer (55).

12 Claims, 7 Drawing Sheets

Prior Art

Prior Art

METHOD FOR DIRECT BONDING TWO SILICON WAFERS FOR MINIMISING INTERFACIAL OXIDE AND STRESSES AT THE BOND INTERFACE, AND AN SOI STRUCTURE

This application claims the benefit of patent No. 60/406,735 and 60/406,720 filed Aug. 29, 2002.

FIELD OF THE INVENTION

The present invention relates to a method for direct bonding two silicon wafers together for minimising interfacial oxide and interfacial stresses at the silicon/silicon bond interface. The invention also relates to a semiconductor substrate formed with two wafers bonded together with interfacial oxide and stresses minimised at the silicon/silicon bond interface. Further, the invention relates to a semiconductor on insulator structure, and to a method for preparing the semiconductor on insulator structure.

BACKGROUND TO THE INVENTION

Semiconductor substrates comprising two silicon wafers directly bonded to define a silicon/silicon bond interface have many uses, for example, integrated circuits may be fabricated in such substrates, and such integrated circuits may include CMOS and/or bipolar devices, PIN diodes, insulated gate bipolar transistors, and the like. Additionally, micro-mechanical components, such as micro-mirrors, as well as micro-electromechanical components may also be formed in such substrates. Indeed, integrated circuits and micro-mechanical and micro-electromechanical components may be fabricated on the same substrate of such semiconductor substrates. A semiconductor substrate formed from wafers of single crystal silicon and of respective different electrical characteristics is particularly suitable for use in the fabrication of integrated circuits comprising semiconductor devices, such as bipolar devices, PIN diodes and insulated gate bipolar transistors.

In the manufacture of semiconductor bipolar devices, for example, PIN diodes and insulated gate bipolar transistors two silicon layers of different resistivity are required. Typically, the layers are formed by deposited silicon (epitaxy) which are deposited on a substrate. The layers must be relatively thick epitaxial silicon layers and are thus relatively expensive to produce, and may suffer from inherent defects. Additionally, the deposition of epitaxial layers requires thermal cycles for the deposition, and it has been found that such thermal cycles can result in the formation of oxide layers, which reduce the operating efficiency of semiconductor bipolar devices subsequently formed. Single crystal silicon wafers together, on the other hand, suffer from relatively few defects, and by forming a substrate by bonding two single crystal silicon wafers, the respective silicon wafers can be selected to have the desired electrical characteristics for PIN diodes and/or insulated gate bipolar transistors.

However, two problems arise in the preparation of a semiconductor substrate from two directly bonded silicon wafers. Firstly, it is virtually impossible to prevent the formation of an interfacial oxide layer at the bond interface. In practice, respective oxide layers form on the faces of the wafers to be bonded together prior to bonding no matter how much care is taken between preparation of the wafers by polishing and cleaning, and the subsequent bonding of the wafers. During bonding the respective oxide layers may remain as a single oxide layer at the bond interface, or the oxide in the layer may migrate to form oxide islands at the bond interface. Such an oxide layer or oxide islands at the bond interface causes many problems. For example, the oxide, be it an interfacial layer or islands, acts as a barrier to dopant movement across the bond interface, the oxide also acts as a barrier to electron flow, and additionally the presence of oxide increases capacitance at the bond interface. The presence of interfacial oxide also increases the gain of polysilicon emitter components of bipolar devices formed adjacent the interfacial oxide layer or islands. Additionally, the presence of an interfacial oxide layer or interfacial oxide islands at a bond interface of such a semiconductor substrate formed from two wafers may render the semiconductor substrate virtually unusable in connection with micro-mechanical or micro-electromechanical components. In general, the presence of interfacial oxide along the bond interface of such a semiconductor substrate can lead to subsequent deformation and/or fracturing or other such failure of the micro-mechanical or micro-electromechanical component in the semiconductor substrate.

Secondly, in practice it has been found virtually impossible to directly bond a pair of silicon wafers together without interfacial stresses being induced in the silicon/silicon bond interface between the bonded wafers forming the semiconductor substrate. In order to minimise interfacial stresses at the bond interface between a pair of directly bonded wafers, it is recommended in the prior art that the silicon wafers forming the semiconductor substrate should be selected to be of the same crystal plane orientation, and furthermore, that the wafers be aligned so that the facial atoms at the bond faces of the silicon/silicon bond interface are accurately aligned with each other. It is known that once both wafers are of the same crystal plane orientation, and the wafers are aligned with each other so that the facial atoms at the bond faces of the respective wafers are accurately aligned at the bond interface, virtually no interfacial stress will develop at the bond interface of the respective wafers.

However, in practice it has been found virtually impossible to accurately align the wafers so that the facial atoms at the bond faces of the respective wafers are accurately aligned at the bond interface. Typically, the wafers are circular, and are provided with a straight alignment edge for facilitating alignment of one wafer with the other. Thus, alignment of the wafers is effectively a mechanical or optical operation whereby the respective alignment edges of the wafers are aligned with each other. Mechanical and optical alignment systems do not permit alignment of the wafers with the degree of accuracy required in order to align the wafers with their respective facial atoms aligned with each other. Thus, in general, the facial atoms at the silicon/silicon bond interface of such bonded wafers are seldom if ever accurately aligned, and if accurately aligned, in general, are aligned by accident only. It has been found that when misaligned, stresses build up between the facial atoms at the bond interface, thus leading to interfacial stresses at the bond interface. Such stresses have a number of disadvantages. For example, electrical resistance at the silicon/silicon bond interface increases with interfacial stress, and furthermore, interfacial stresses can lead to bowing and even fracturing of micro-mechanical components, for example, micro-mirrors, where such components are fabricated in the semiconductor substrate formed by such bonded wafers. Additionally, interfacial stresses induced in the bond interface between directly bonded wafers of such semiconductor substrates cause crystal dislocations in the silicon at and near the bond interface. Such crystal dislocations can act as trapping and recombination sites of charge carriers, and can also accumulate chemical impurity species. Both of these effects degrade the performance of electronic devices formed in such semiconductor substrates.

There is therefore a need for a method for bonding two silicon wafers together in which interfacial stresses and interfacial oxide along the bond interface of the wafers are minimised. There is also a need for a semiconductor substrate formed from two directly bonded silicon wafers in which interfacial stresses and interfacial oxide along the bond interface of the respective wafers are minimised. In particular, there is a need for such a semiconductor substrate which is suitable for subsequent use in the fabrication of electronic devices, such as, for example, CMOS devices, bipolar devices, PIN diodes, insulated gate bipolar transistors and other such devices, as well as micro-mechanical and micro-electromechanical components. Furthermore, there is a need for a semiconductor on insulator structure which is suitable for subsequent use in the fabrication of electronic devices, such as, for example, CMOS devices, bipolar devices, PIN diodes, insulated gate bipolar transistors, as well as micro-mechanical and micro-electromechanical components.

The present invention is directed towards providing a method for direct bonding two silicon wafers together for minimising interfacial oxide and/or minimising interfacial stresses along the silicon/silicon bond interface. The invention is also directed towards providing a semiconductor substrate comprising two silicon wafers directly bonded together in which interfacial oxide and/or interfacial stresses along the silicon/silicon bond interface are minimised. Further, the invention is directed towards providing a semiconductor on insulator structure, and a method for preparing such a semiconductor on insulator structure.

SUMMARY OF THE INVENTION

According to the invention there is provided a method for direct bonding of two silicon wafers together for minimising interfacial oxide at the silicon/silicon bond interface, each wafer defining a bond face for bonding to the bond face of the other wafer for defining the bond interface, the method comprising the steps of:

selecting the silicon wafers so that the oxygen content of the respective wafers is such as to accommodate absorption of oxygen into at least one of the wafers through the bond face thereof, abutting the bond faces of the respective wafers together, and annealing the wafers at a bond anneal temperature sufficient for fusion bonding of the wafers at the bond faces thereof, and for facilitating absorption of oxygen from interfacial oxide between the bond faces into the at least one of the wafers.

Preferably, the oxygen content of the respective wafers is such as to accommodate absorption of oxygen from the interfacial oxide into both of the wafers through their respective bond faces during fusion bonding thereof. Advantageously, each wafer is selected to have an oxygen content below the limit of solid solubility of oxygen in the wafer. Ideally, the amount by which the oxygen content of the respective wafers is below the limit of solid solubility of oxygen in the wafers is substantially similar in both wafers.

In one embodiment of the invention the oxygen content of at least one of the wafers does not exceed $1 \times 10^{17}$ atoms oxygen per $cm^3$ silicon, and preferably, the oxygen content of at least one of the wafers does not exceed $5 \times 10^{16}$ atoms oxygen per $cm^3$ silicon.

In one embodiment of the invention the bond anneal temperature at which the wafers are fusion bonded is at least 900° C., and preferably, the bond anneal temperature at which the wafers are fusion bonded lies in the range of 1,000° C. to 1,250° C., and preferably, in the range of 1,000° C. to 1,200° C.

In another embodiment of the invention the wafers are subjected to the bond anneal temperature for fusion bonding for a bonding period of at least 30 minutes, and preferably, the bonding period during which the wafers are subjected to the bond anneal temperature for fusion bonding lies in the range of 60 minutes to 240 minutes. Ideally, the bond period during which the wafers are subjected to the bond anneal temperature for fusion bonding is approximately 180 minutes.

Preferably, the wafers are subjected to the bond anneal temperature for fusion bonding within six hours of the bond faces thereof having been abutted together. If the wafers are not subjected to the bond anneal temperature for fusion bonding within six hours, the wafers should preferably be subjected to a preliminary anneal at a temperature not less than 400° C. for a time period in the range of 60 minutes to 240 minutes substantially immediately after the bond faces have been abutted together in order to prevent outgassing from the wafers, and for minimising oxidation of the bond faces.

Preferably, the bond faces of the respective wafers are cleaned prior to being abutted together, and advantageously, the bond faces of the respective wafers are cleaned using one of the following cleaning procedures:

cleaning with a dilute hydrofluoric cleaning solution in order to provide the bond faces as hydrophobic faces, and cleaning with an RCA wash for providing the bond faces as hydrophilic.

Ideally, the cleaned bond faces of the respective wafers are dried in a nitrogen enriched atmosphere, and are abutted together substantially immediately after drying in order to minimise the formation of native oxide layers on the bond faces of the respective wafers. Preferably, the bond faces of the respective wafers are polished prior to cleaning.

In one embodiment of the invention at least one of the wafers is of float-zone (FZ) silicon.

In another embodiment of the invention the electrical resistivities of the respective wafers are different. Preferably, the electrical resistivity of one of the wafers is in the range of 2 kohmcm to 20 kohmcm, and the resistivity of the other wafer is in the range of 0 ohmcm to 20 ohmcm.

In one embodiment of the invention the wafers are selected so that the number of atoms per unit surface area at the bond face of one of the wafers is different to the number of atoms per unit surface area at the bond face of the other wafer for minimising interfacial stress at the bond interface.

In another embodiment of the invention the bond faces of the respective wafers define respective crystal planes, and the wafers are selected so that the crystal plane defined by the bond face of one of the wafers is oriented at a different angle to the crystal plane defined by the bond face of the other wafer, so that the number of atoms per unit surface area at the bond faces of the respective wafers are different. Preferably, the angular difference of the orientations of the crystal planes of the respective wafers lies in the range of 1° to 89°. Advantageously, the angular difference of the orientations of the crystal planes of the respective wafers lies in the range of 1° to 75°.

Ideally, one of the wafers is selected from one of the following wafer types, and the other wafer is selected from another one of the following wafer types:

<111> crystal plane orientation wafer,
<100> crystal plane orientation wafer and
<110> crystal plane orientation wafer.

In another embodiment of the invention the wafers are provided with respective alignment edges, and the wafers are aligned with their respective alignment edges in alignment when the bond faces thereof are being abutted together.

Additionally, the invention provides a method for directly bonding two silicon wafers together for minimising interfacial stresses at the silicon/silicon bond interface, each wafer defining a bond face for bonding to the bond face of the other wafer for defining the bond interface, the method comprising the steps of:

selecting the wafers so that the number of atoms per unit surface area at the bond face of one of the wafers is different to the number of atoms per unit surface area at the bond face of the other wafer, abutting the bond faces of the respective wafers together, and bonding the wafers at the bond faces.

In one embodiment of the invention the bond faces of respective wafers define respective crystal planes, and the wafers are selected so that the crystal plane defined by the bond face of one of the wafers is oriented at a different angle to the crystal plane defined by the bond face of the other wafer so that the number of atoms per unit surface area at the respective bond faces are different. Preferably, the angular difference of the orientations of the crystal planes of the respective wafers lies in the range of 1° to 89°. Advantageously, the angular difference of the orientations of the crystal planes of the respective wafers lies in the range of 1° to 75°. Ideally, the angular difference of the orientations of the crystal planes of the respective wafers is approximately 55°.

In one embodiment of the invention one of the wafers is selected from one of the following wafer types, and the other wafer is selected from another of the following wafer types:

<111> crystal plane orientation wafer,
<100> crystal plane orientation wafer, and
<110> crystal plane orientation wafer.

In another embodiment of the invention the wafers are bonded together by fusion bonding at a bond anneal temperature in the range of 900° C. to 1,250° C., and preferably, the bond anneal temperature at which the wafers are fusion bonded lies in the range of 1,000° C. to 1,200° C.

In one embodiment of the invention the wafers are subjected to the bond anneal temperature for fusion bonding for a bonding period in the range of 30 minutes to 240 minutes. Preferably, the bond period during which the wafers are subjected to the bond anneal temperature for fusion bonding is approximately 180 minutes.

Alternatively, the wafers are bonded together by plasma bonding.

In one embodiment of the invention the wafers are provided with respective alignment edges, and the wafers are aligned with their respective alignment edges in alignment when the bond faces thereof are being abutted together.

Further the invention provides a method for preparing a semiconductor on insulator structure comprising the following steps in any order:

directly bonding a first wafer of semiconductor material to a second wafer of semiconductor material along a bond interface defined by abutting bond faces of the respective wafers, forming an electrically insulating layer on at least one of an insulating layer abutting face of the second wafer opposite the bond face thereof and an insulating layer abutting face of a third wafer of semiconductor material, and bonding the second and third wafers with the insulating layer located therebetween.

In one embodiment of the invention the first and second wafers are bonded prior to bonding of the second and third wafers.

In another embodiment of the invention the insulating layer is formed on the insulating layer abutting face of the third wafer, and the second wafer is bonded to the insulating layer with the insulating layer abutting face of the second wafer abutting the insulating layer.

In another embodiment of the invention the insulating layer is a grown layer, and preferably, the insulating layer is an oxide layer.

In one embodiment of the invention the second and third wafers with the insulating layer located therebetween are fusion bonded by bond annealing at a bond anneal temperature in the range of 900° C. to 1,250° C.

In one embodiment of the invention at least one of the first and second wafers are of silicon, and preferably, of single crystal silicon.

In another embodiment of the invention the first and second wafers are of silicon, and advantageously, the first and second wafers are selected so that the oxygen content of the respective first and second wafers is such as to accommodate absorption of oxygen into at least one of the first and second wafers through the bond face thereof, and the first and second wafers are bonded by fusion bonding at a bond anneal temperature sufficient for facilitating absorption of oxygen from interfacial oxide between the bond faces into the at least one of the first and second wafers, and preferably, the oxygen content of the respective first and second wafers is such as to accommodate absorption of oxygen from the interfacial oxide into both of the first and second wafers through their respective bond faces during fusion bonding thereof, and advantageously, each of the first and second wafers is selected to have an oxygen content below the limit of solid solubility of oxygen in the wafer, and ideally, the amount by which the oxygen content of the respective first and second wafers is below the limit of solid solubility of oxygen in the wafers is substantially similar in both wafers.

In another embodiment of the invention the oxygen content of at least one of the first and second wafers does not exceed $1 \times 10^{17}$ atoms oxygen per $cm^3$ silicon, and preferably, the oxygen content of at least one of the first and second wafers does not exceed $5 \times 10^{16}$ atoms oxygen per $cm^3$ silicon.

In one embodiment of the invention the bond anneal temperature at which the first and second wafers are fusion bonded is at least 900° C. Advantageously, the bond anneal temperature at which the first and second wafers are fusion bonded lies in the range of 1,000° C. to 1,250° C.

In another embodiment of the invention the first and second wafers are subjected to the bond anneal temperature for fusion bonding for a bonding period of at least 30 minutes. Preferably, the first and second wafers are subjected to the bond anneal temperature for fusion bonding within six hours of the bond faces thereof having been abutted together.

Preferably, the electrical resistivities of the respective first and second wafers are different.

In one embodiment of the invention the first and second wafers are selected so that the number of atoms per unit surface area at the bond face of one of the first and second wafers is different to the number of atoms per unit surface area at the bond face of the other of the first and second wafers for minimising interfacial stress at the bond interface.

In another embodiment of the invention the bond faces of the respective first and second wafers define respective crystal planes, and the first and second wafers are selected so that the crystal plane defined by the bond face of one of the first and second wafers is oriented at an angle which is different to the angle of the crystal plane defined by the bond face of the other of the first and second wafers, so that the number of atoms per unit surface area at the bond faces of the respective first and second wafers are different.

In a further embodiment of the invention one of the first and second wafers is selected from one of the following wafer types, and the other of the first and second wafers is selected from another one of the following wafer types:
    <111> crystal plane orientation wafer,
    <100> crystal plane orientation wafer and
    <110> crystal plane orientation wafer.

Preferably, the first and second wafers are provided with respective alignment edges, and the first and second wafers are aligned with their respective alignment edges in alignment when the bond faces thereof are being abutted together.

The invention also provides a semiconductor substrate formed from a pair of silicon wafers directly bonded together to form a silicon/silicon bond interface along which interfacial oxide is minimised, each wafer defining a bond face for bonding to the bond face of the other wafer for defining the bond interface, the respective silicon wafers being fusion bonded together at a bond anneal temperature, and the wafers being selected so that the oxygen content of the respective wafers is such as to facilitate absorption of oxygen from interfacial oxide between the bond faces into at least one of the wafers at the bond anneal temperature during fusion bonding of the wafers.

Preferably, each wafer is selected to have an oxygen content below the limit of solid solubility of oxygen in the wafer.

Advantageously, the oxygen content of at least one of the wafers does not exceed $1 \times 10^{17}$ atoms oxygen per $cm^3$ silicon.

Further the invention provides a semiconductor substrate formed from a pair of silicon wafers directly bonded together to form a silicon/silicon bond interface in which interfacial stresses at the silicon/silicon bond interface are minimised, each wafer defining a bond face to be bonded to the bond face of the other wafer, the wafers being selected so that the number of atoms per unit surface area at the bond face of one of the wafers is different to the atoms per unit surface area at the bond face of the other wafer, so that when the wafers are bonded along their respective bond faces the interfacial stresses are minimised.

In one embodiment of the invention the bond faces of the respective wafers define respective crystal planes, and the wafers are selected so that the crystal plane defined by the bond face of one of the wafers is oriented at a different angle to the crystal plane defined by the bond face of the other wafer, so that the number of atoms per unit surface area at the bond faces of the respective wafers are different. Preferably, the angular difference of the orientations of the crystal planes of the respective wafers lies in the range of 1° to 89°. Advantageously, the angular difference of the orientations of the crystal planes of the respective wafers lies in the range of 1° to 75°.

In another embodiment of the invention one of the wafers is selected from one of the following wafer types, and the other wafer is selected from another of the following wafer types:
    <111> crystal plane orientation wafer,
    <100> crystal plane orientation wafer, and
    <110> crystal plane orientation wafer.

The invention also provides a semiconductor on insulator structure comprising:
    a first wafer of semiconductor material defining a bond face,
    a second wafer of semiconductor material defining a bond face, the second wafer being directly bonded to the first wafer with the bond faces of the respective first and second wafers abutting each other along a bond interface,
    a third wafer of semiconductor material, and
    an electrically insulating layer located between the second wafer and the third wafer.

In one embodiment of the invention the insulating layer is an oxide layer.

In another embodiment of the invention the first and second wafers are of silicon, and preferably of single crystal silicon, and advantageously, are selected so that the oxygen content of the respective first and second wafers is such as to accommodate absorption of oxygen into at least one of the first and second wafers through the bond face thereof, and the first and second wafers are bonded by fusion bonding at a bond anneal temperature sufficient for facilitating absorption of oxygen from interfacial oxide between the bond faces into the at least one of the first and second wafers.

In a further embodiment of the invention the first and second wafers are selected so that the number of atoms per unit surface area at the bond face of one of the first and second wafers is different to the number of atoms per unit surface area at the bond face of the other of the first and second wafers for minimising interfacial stress at the bond interface.

In another embodiment of the invention the bond faces of the respective first and second wafers define respective crystal planes, and the first and second wafers are selected so that the crystal plane defined by the bond face of one of the first and second wafers is oriented at an angle which is different to the angle of the crystal plane defined by the bond face of the other of the first and second wafers, so that the number of atoms per unit surface area at the bond faces of the respective first and second wafers are different.

ADVANTAGES OF THE INVENTION

The advantages of the invention are many. The semiconductor substrate formed by direct bonding of the silicon wafers using the method according to the invention is particularly suitable for subsequent use in the fabrication of electronic components, such as semiconductor devices, for example, bipolar devices, PIN diodes, insulated gate bipolar transistors, and other such electronic components. Additionally, the semiconductor substrate formed according to the invention is also particularly suitable for use in the subsequent fabrication of micro-mechanical and micro-electro-mechanical components therein. Indeed, the semiconductor substrate formed by the method according to the invention is particularly suitable for subsequent use in the formation of integrated circuits including CMOS devices, bipolar devices, PIN diodes and insulated gate bipolar transistors along with micro-mechanical or micro-electromechanical components on the same substrate. By virtue of the fact that interfacial oxide along the bond interface of the wafers of the semiconductor substrate is minimised, and effectively eliminated, dopant diffused into one of the wafers diffuses through the bond interface to the other wafer without hindrance. Additionally, the absence of interfacial oxide avoids any additional capacitance being formed between, for example, the base and emitter of insulated gate bipolar transistors, and furthermore, there is no increase in the gain of the bipolar transistors. Furthermore, by minimising interfacial stresses at the silicon/silicon bond interface of the semiconductor substrate, the formation of crystal dislocations in the silicon at or near the bond interface are avoided, thereby avoiding carrier trapping and recombination, and degradation of carrier transport across the bond interface in electronic devices formed in the semiconductor substrate adjacent the bond interface.

Additionally, by virtue of the fact that interfacial oxide is minimised, and in general, eliminated along the silicon/silicon bond interface of the wafers forming the semiconductor substrate, the semiconductor substrate is also particularly suitable for the formation of micro-mechanical components, for example, micro-mirrors, and indeed for micro-electromechanical components also. The minimisation and/or elimination of the interfacial oxide minimises weaknesses in subsequently formed micro-mechanical components, which would otherwise lead to failure, and in particular, deformation or fracture of the components.

Where the wafers of the semiconductor substrate according to the invention are selected to be of different crystal plane orientation, the interfacial stress at the bond interface of the wafers is minimised or eliminated, and in turn crystal dislocations at or near the bond interface are minimised or substantially eliminated. Accordingly, the semiconductor substrate with interfacial stresses minimised or eliminated, and thus crystal dislocations minimised or substantially eliminated is particularly suitable for use in the manufacture of micro-mechanical and micro-electromechanical components, since the minimisation and/or elimination of the interfacial stresses and crystal dislocations along the silicon/silicon bond interface of the wafer avoids any danger of bowing, warping and indeed subsequent fracturing or failure of the micromechanical components.

Additionally, the minimisation of interfacial stresses and in turn crystal dislocation along the bond interface of the wafers of the semiconductor substrate according to the invention minimises variation in resistivity along the silicon/silicon bond interface, which would otherwise impair the functioning of bipolar devices, PIN diodes, insulated gate bipolar transistors, and other such devices formed in the semiconductor substrate adjacent the bond interface. By minimising and substantially eliminating crystal dislocations along the bond interface, the possibility of chemical contaminants accumulating along the bond interface is effectively eliminated, and thus, variations in resistivity along the bond interface, which would otherwise be caused by trapped chemical contaminants is minimised. Accordingly, degradation of electronic components formed in the semiconductor substrate adjacent the bond interface thereof is minimised.

The semiconductor on insulator structure according to the invention has many advantages. It is suitable for both use in the formation of integrated circuits comprising CMOS devices, bipolar devices, PIN diodes, insulated gate bipolar transistors, and other such integrated circuit components, and it is also suitable for the formation of micro-mechanical and micro-electromechanical components. By virtue of the fact that the first and second wafers are directly bonded together, the semiconductor substrate formed by the first and second wafers of the semiconductor on insulator structure is particularly suitable for use in the fabrication of integrated circuits comprising bipolar devices, as well as PIN diodes, insulated gate bipolar transistors and other such components. By selecting the first and second wafers of the semiconductor on insulator structure to be of single crystal silicon and of different resistivities, a silicon on insulator (SOI) structure which is particularly suitable for the fabrication of integrated circuits is provided, and the integrated circuits can readily be formed in the first and second wafers. This, thus, eliminates the need for providing an epitaxial layer, since the first wafer effectively takes the place of a conventional epitaxial layer. By selecting the first and second wafers to be of appropriate oxygen content for minimising interfacial oxide along the bond interface of the first and second wafers, a more preferred SOI structure is provided, which is particularly suitable for use in the fabrication of integrated circuits and micro-mechanical and micro-electromechanical components, where the integrated circuit and the micro-mechanical and micro-electromechanical components are formed in the first and second wafers. By selecting the first and second wafers of the SOI structure to be of crystal plane orientation for minimising the interfacial stresses, and in turn crystal dislocations at or near the bond interface, the SOI structure is particularly suitable for use in the preparation of integrated circuits and micro-mechanical and micro-electromechanical components, where such integrated circuits and micro-mechanical and micro-electromechanical components are formed in the first and second wafers. Indeed, by selecting the first and second wafers to be of appropriate oxygen content and appropriate crystal plane orientation for both minimising interfacial oxide and interfacial stresses along the bond interface of the first and second wafers, a particularly advantageous SOI structure is provided, in which integrated circuits and micro-mechanical and micro-electromechanical components can be formed in the substrate formed by the first and second wafers.

The invention and its advantages will be more clearly understood from the following description of some preferred embodiments thereof, which are given by way of non-limiting examples, with reference to the accompanying drawings.

DETAILED DESCRIPTION OF PREFERRED EMBODIMENTS OF THE INVENTION

Figure 1:
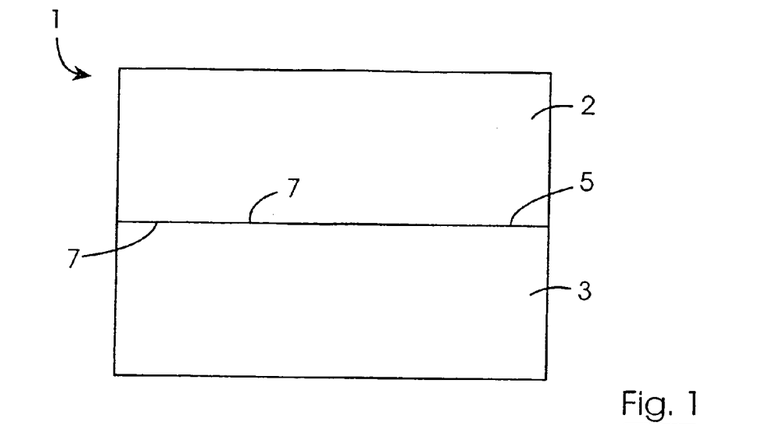
FIG. 1 is a transverse cross-sectional elevational view of a semiconductor substrate according to the invention.
Figure 2:
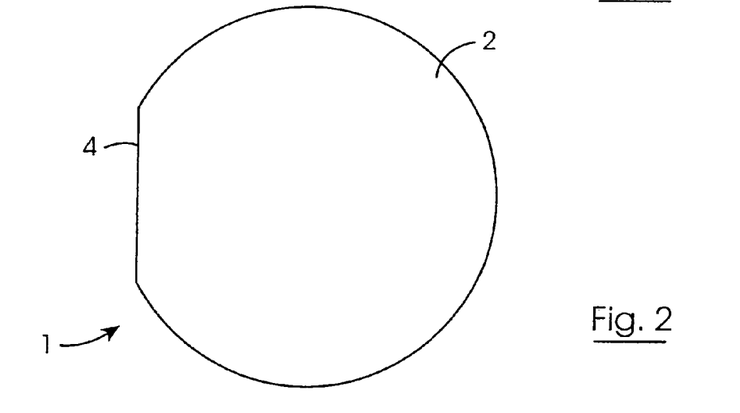
FIG. 2 is a plan view of the semiconductor substrate of FIG. 1.

Referring to the drawings and initially to FIGS. 1 and 2, there is illustrated a semiconductor substrate according to the invention, indicated generally by the reference numeral 1. The substrate 1 comprises a pair of silicon wafers, namely, a first wafer 2 and a second wafer 3 both of single crystal silicon, which are bonded directly together along a silicon/silicon bond interface 5, along which interfacial oxide and interfacial stresses are minimised. By minimising interfacial stresses along the bond interface 5, crystal dislocations at and near the bond interface 5, which would otherwise result from such interfacial stresses are minimised and effectively eliminated. The substrate 1 is particularly suitable for forming electronic components, for example, bipolar devices, PIN diodes and insulated gate bipolar transistors, and indeed, any other electronic components which require two silicon layers of respective different electrical characteristics, and in particular, two layers of different electrical resistivity. The semiconductor substrate 1 is also suitable for forming micro-mechanical components, for example, micromirrors, and the semiconductor substrate 1 is also suitable for forming micro-electromechanical components.

The first and second wafers 2 and 3 are circular of diameter of 100 mm, but may be of any desired diameter, for example, 100 mm to 300 mm, and each wafer 2 and 3 is provided with an alignment edge 4 for facilitating alignment of the first and second wafers 2 and 3. The thickness of the respective wafers may be any suitable thickness, but typically, will be in the range of 200 μm to 1,000 μm.

The first and second wafers 2 and 3 define respective bond faces 7 which are abutted together to form the bond interface 5. Each bond face 7 defines a crystal plane of the corresponding wafer. The first and second wafers 2 and 3 may be selected so that the crystal plane orientation of the respective first and second wafers 2 and 3 is the same or different. However, it has been found that by selecting the first and second wafers 2 and 3 so that the orientation of the crystal planes of the respective wafers are different, reduces interfacial stresses along the bond interface 5. This is due to the fact that the number of atoms per unit surface area at the bond faces of the respective first and second wafers 2 and 3 are different, when the crystal plane orientation of the wafers 2 and 3 are different. The effect of selecting the first and second wafers 2 and 3 so that the orientation of the crystal planes of the respective wafers 2 and 3 are different for reducing interfacial stresses along the bond interface 5 is described in more detail below with reference to FIGS. 10 and 11.

In this embodiment of the invention in order to minimise interfacial stresses along the silicon/silicon bond interface 5, the first and second wafers 2 and 3 are selected to have different crystal plane orientations, so that the number of atoms per unit surface area at the bond faces 7 of the respective first and second wafers 2 and 3 are different. In this embodiment of the invention the first wafer 2 is selected to be of <111> orientation, and the second wafer 3 is selected to be of <100> orientation.

In order to minimise interfacial oxide along the bond interface 5, the first and second wafers 2 and 3 are each selected to have a relatively low oxygen content, and in particular an oxygen content which is well below the limit of solid solubility of oxygen in the respective wafers. In this embodiment of the invention both the first and second wafers 2 and 3 are of float-zone (FZ) single crystal silicon. The oxygen content of the first wafer 2 is approximately $1 \times 10^{16}$ atoms oxygen per $cm^3$ silicon, while its limit of solid solubility at 1,000° C. is approximately $2 \times 10^{17}$ atoms oxygen per $cm^3$ silicon. The oxygen content of the second wafer 3 is $1 \times 10^{16}$ atoms oxygen per $cm^3$ silicon, and the limit of solid solubility of the second wafer 3 at 1,000° C. is $2 \times 10^{17}$ atoms oxygen per $cm^3$ silicon.

The first wafer 2 is lightly doped with phosphorus to be an $n^-$ type wafer, and to provide the first wafer 2 with a relatively high resistivity of the order of 2,000 ohmcm to 4,000 ohmcm. The second wafer 3 is relatively highly doped with phosphorus to provide an n type wafer with a relatively low resistivity of the order of 14 ohmcm to 20 ohmcm. Although, the second wafer 3 may be doped to be of higher resistivity than the first wafer 2 if desired.

Prior to bonding the first and second wafers 2 and 3, the bond faces 7 of the respective first and second wafers 2 and 3 are initially polished to a low surface roughness in a chemical or mechanical polishing process, or in a combined chemical and mechanical polishing process, all of which will be well known to those skilled in the art. After polishing, the bond faces 7 are cleaned with a dilute hydrofluoric cleaning solution followed by a water rinse, in order to provide the bond faces 7 as being hydrophobic. If it is desired to provide the bond faces 7 as being hydrophilic, in order to minimise surface particles, an RCA chemical wash is used. The cleaning and rinsing of the respective bond faces 7 is carried out in a nitrogen atmosphere, and after cleaning and rinsing, the first and second wafers 2 and 3 are dried at a temperature in the range of 20° C. to 40° C. in the nitrogen atmosphere in order to minimise oxidation of the bond faces 7 of the respective first and second wafers 2 and 3. Almost immediately after drying, and preferably, within sixty seconds of drying, the wafers 2 and 3 are joined together by abutting the bond faces of the respective wafers 2 and 3 together. This is achieved by first aligning the respective first and second wafers 2 and 3 by mechanically aligning their respective alignment edges 4, and then bringing the respective bond faces of the first and second wafers 2 and 3 together.

Almost immediately after the first and second wafers 2 and 3 are aligned and joined with the respective bond faces 7 abutting each other, the joined first and second wafers 2 and 3 are subjected to a preliminary anneal at a temperature in the order of 600° C. for a time period of approximately 60 minutes. The preliminary anneal prevents outgassing from the first and second wafers 2 and 3, and also minimises oxidation of the bond faces 7 prior to final bonding of the first and second wafers together. This allows final bond annealing of the first and second wafers 2 and 3 to be deferred. In the absence of the preliminary anneal of the first and second wafers 2 and 3, the final fusion bonding by bond annealing of the first and second wafers 2 and 3 would have to take place relatively shortly after joining the wafers 2 and 3 together, and typically, within six hours of joining the wafers 2 and 3 together, in order to minimise outgassing and the growth of native oxide on the bond faces 7. The preliminary anneal prevents further physical and chemical changes at the bond faces 7, and thus, final bond can be deferred to any convenient time. It is, however, important that the first and second wafers 2 and 3 be subjected to either a preliminary anneal or final fusion bonding as soon as possible after joining the wafers 2 and 3 together, and preferably, within six hours of the wafers 2 and 3 being joined together, in order to minimise the growth of native oxide and/or physical or chemical changes at the bond faces 7 prior to the preliminary anneal or the final fusion bond anneal. However, where the first and second wafers 2 and 3 are to be subjected to final fusion bond anneal within six hours of the bond faces 7 having been dried and abutted together, the preliminary anneal step is omitted.

In this embodiment of the invention within forty-eight hours of being subjected to the preliminary anneal, the first and second wafers 2 and 3 are subjected to the final fusion bond anneal, which is anneal fusion bonding at a bond anneal temperature of approximately 1,150° C. for a time period of approximately 180 minutes for bonding the bond faces 7 of the first and second wafers 2 and 3 together. The fusion bonding of the first and second wafers 2 and 3 is carried out in a suitable anneal furnace in a nitrogen environment.

After fusion bonding of the first and second wafers, the semiconductor substrate 1 is removed from the anneal furnace, and is ready for use. In general, one or both of the first and second wafers 2 and 3 will be ground and polished so that the first and second wafers 2 and 3 are of respective desired depths, and thereafter the components, be they electronic, micro-mechanical or micro-electromechanical components, or a combination of such components, are fabricated in the semiconductor substrate 1.

As mentioned above, it has been found that by minimising the time period between joining of the first and second wafers 2 and 3 together and subjecting the wafers 2 and 3 to the preliminary anneal or final fusion bonding native oxide layers which grow on the bond faces 7 are minimised, and are no more than a few mono-layers thick. It has also been found that by fusion bonding the first and second wafers 2 and 3 at a bond anneal temperature in the range of 1,000° C. to 1,200° C. for a bonding time period in the range of sixty minutes to two hundred and forty minutes, the oxide of the native oxide layers on the bond faces 7, and any other oxide formed on the bond faces 7 migrates through the bond faces 7 into the first and second wafers 2 and 3, provided the first and second wafers 2 and 3 are of relatively low oxygen content, and preferably, the oxygen content is well below the limit of solid solubility of oxygen in the wafers at the bond anneal temperature. Thus, by the end of the final fusion bonding all the oxide on the bond faces 7 is absorbed into the first and second wafers 2 and 3, thus leaving a silicon/silicon bond interface 5, which is virtually free of oxide.

In this embodiment of the invention as mentioned above, the crystal plane orientation of the first wafer 2 is <111> and the crystal plane orientation of the second wafer 3 is <100>, and it has been found that selecting the wafers to be of different crystal plane orientations minimises and effectively eliminates interfacial stresses along the silicon/silicon bond interface 5, and thus, crystal dislocations at or near the bond interface 5.

Figure 3:
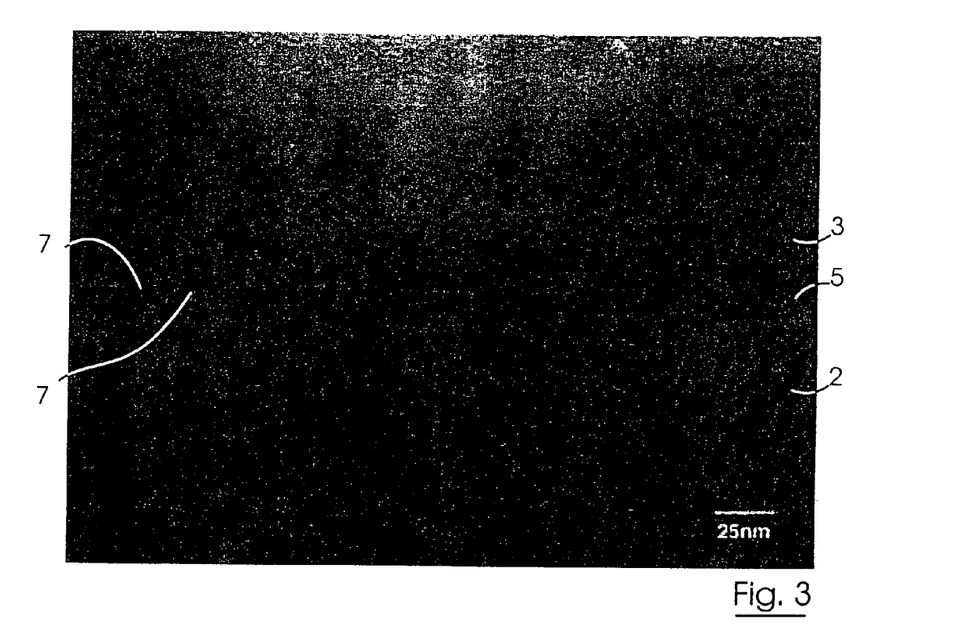
FIG. 3 is a photo-micrograph of a cross-section of a portion of the semiconductor substrate of FIG. 1.
Figure 4:
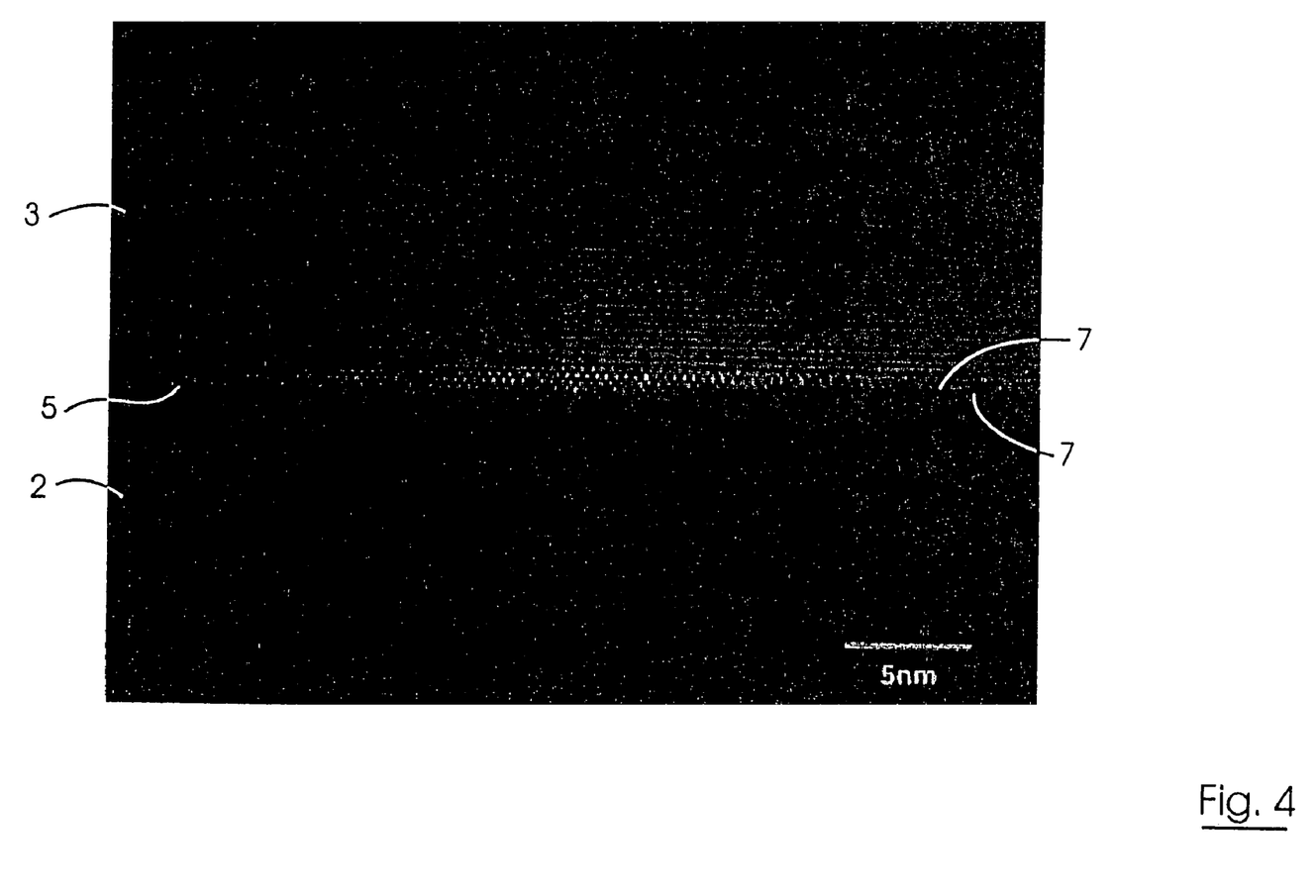
FIG. 4 is another photo-micrograph of the cross-section of the semiconductor substrate of FIG. 1 at a higher magnification to that of FIG. 3.

Referring now to FIGS. 3 and 4, photo-micrographs of a cross-section of the semiconductor substrate 1 obtained by transmission electron microscopy (TEM) are illustrated. The semiconductor substrate 1 was sectioned and was prepared for TEM by mechanical polishing and Ar⁺ ion milling from the centre of the substrate. A JEOL 4000EX TEM at 400 keV was used in obtaining the photo-micrographs of FIGS. 3 and 4. The TEM images from which the photo-micrographs have been obtained are bright field images. The magnification of the substrate 1 in the photo-micrograph of FIG. 3 is 480,000×, while the magnification of the substrate 1 in the photo-micrograph of FIG. 4 is 3,800,000×. As can be seen, the silicon/silicon bond interface 5 between the first and second wafers 2 and 3 is free of oxide and oxide islands. Additionally, the bond interface 5 of the first and second wafers 2 and 3 is free of stress fringes, indicating the absence of interfacial stresses along the bond interface 5.

TABLE 1

| 1 Group | 2 Diameter | 3 Type | 4 Dopant | 5 Resistivity | 6 Orientation | 7 Growth |
|---|---|---|---|---|---|---|
| A | 100 mm | n⁻ | Phosphorous | 2–4 Kohmcm | <111> | FZ |
| B | 100 mm | n⁺ | Arsenic | 0–0.07 ohmcm | <100> | Cz |
| C | 100 mm | n⁺ | Arsenic | 0–0.07 ohmcm | <111> | Cz |
| D | 100 mm | n | Phosphorous | 6–10 ohmcm | <100> | Cz |
| E | 100 mm | n | Phosphorous | 14–20 ohmcm | <100> | FZ |
| F | 100 mm | n⁺ | Antimony | <0.01 ohmcm | <100> | Cz |

Particulars of wafers used in experiments to compare semiconductor substrates prepared according to the invention with semiconductor substrates which were not prepared in accordance with the invention In order to contrast the advantages of semiconductor substrates formed according to the invention, with those not formed according to the invention, a number of experiments have been carried out by preparing semiconductor substrates by fusion bonding different types of silicon wafers. Particulars of the different types of silicon wafers used in the experiments are set out in Table 1. Column 1 of Table 1 identifies the group from which the wafers were selected, and as can be seen, there are six groups of different types of wafers, namely, groups A to F. The wafers of all the groups are circular of 100 mm diameter, see column 2. The wafers of group A are identical to the first wafer 2 of the semiconductor substrate 1 described with reference to FIGS. 1 and 2, the particulars of which have already been described.

The wafers of group E are similar to the second wafer 3 of the semiconductor substrate 1 which has already been described. The wafers of groups B, C, D and F are Czochralski (Cz) wafers, see column 7, and are thus supersaturated with oxygen. The crystal plane orientation of the wafers of groups B, D, E and F is <100>, while the crystal plane orientation of the wafers of groups A and C is <111>, see column 6. The wafers of groups B and C are highly doped with arsenic to be of n⁺ and of low resistivity 0 ohmcm to 0.07 ohmcm, see columns 4, 3 and 5, respectively. The wafers of group F are highly doped with antimony to be n⁺ and of low resistivity of less than 0.01 ohmcm. The wafers of groups D and E are doped with phosphorus to be n and are of low resistivity of 6 ohmcm to 10 ohmcm and 14 ohmcm to 20 ohmcm, respectively.

In the experiments five semiconductor substrates were prepared by bonding pairs of wafers of group A together. The respective pairs were fusion bonded at different bond anneal temperatures. One pair of wafers of group A were fusion bonded at an anneal temperature of 1,000° C., and the remaining four pairs were fusion bonded at bond anneal temperatures of 1,050° C., 1,100° C., 1,150° C. and 1,200° C., respectively. Five semiconductor substrates were prepared by bonding wafers from groups A and B, and the respective pairs of wafers A and B were fusion bonded at bond anneal temperatures of 1,000° C., 1,050° C., 1,100° C., 1,150° C. and 1,200° C. Five semiconductor substrates were prepared by bonding wafers from groups A and C and fusion bonding the pairs of wafers at the five bond anneal temperatures 1,000° C., 1,050° C., 1,100° C., 1,150° C. and 1,200° C. Similarly, five semiconductor substrates were prepared from the wafers of groups A and D, A and E and A and F, and in each case the pairs of wafers were fusion bonded at the five bond anneal temperatures.

Each pair of wafers were subjected to the same polishing, cleaning, rinsing and drying processes as the first and second wafers 2 and 3 in the preparation of the semiconductor substrate 1, and the wafers of each pair of wafers after being joined together were subjected to a preliminary anneal at a temperature of 600° C. for the same time period as were the first and second wafers 2 and 3 of the semiconductor substrate 1. Each of the pairs of wafers were subjected to final fusion bonding at the respective bond anneal temperatures of 1,000° C., 1,050° C., 1,100° C., 1,150° C. and 1,200° C. for a time period of 180 minutes similar to that to which the first and second wafers 2 and 3 of the semiconductor substrate 1 were subjected. The time intervals between drying and joining the wafers together and the preliminary anneal, and between the preliminary anneal and fusion bonding were substantially similar in the case of all pairs of wafers, and were similar to the corresponding intervals which occurred during the preparation of the semiconductor substrate 1 from the first and second wafers 2 and 3.

The respective pairs of wafers fusion bonded at the respective different anneal temperatures were prepared for transmission electron microscopy in the same manner as the semiconductor substrate 1 of the first and second wafers 2 and 3. From these results it has been found that in the case of all the semiconductor substrates formed by bonding the wafers of groups A and B, groups A and C, groups A and D, and groups A and F oxide islands remain at the silicon/silicon bond interface 5.

Figure 5:
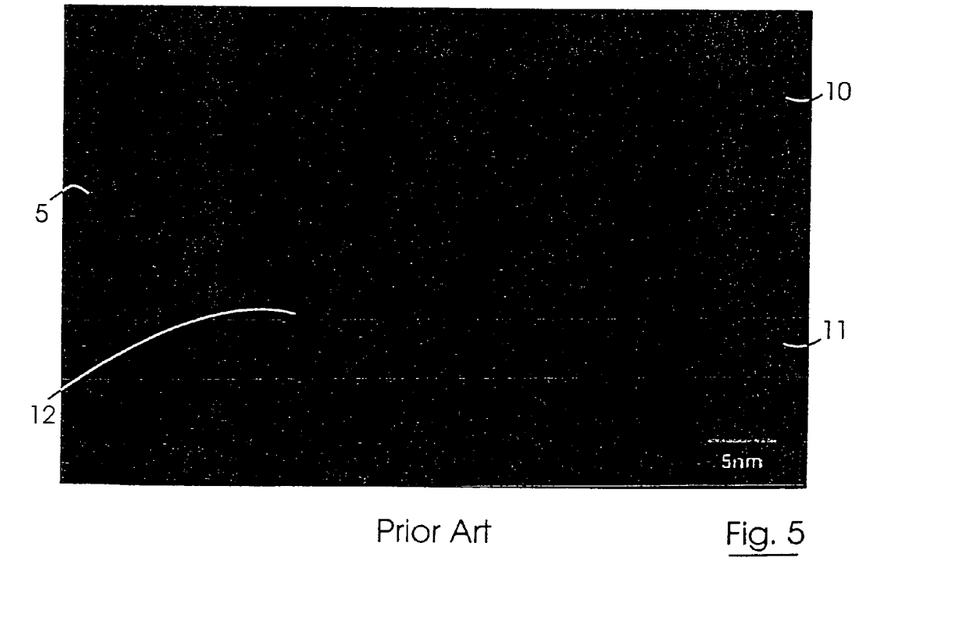
FIG. 5 is a photo-micrograph illustrating a cross-section of a portion of a semiconductor substrate not according to the invention.

FIG. 5 illustrates a TEM photo-micrograph of a cross-section along a bond interface of a substrate formed by a wafer of group A and a wafer of group D. The photo-micrograph is of similar magnification to that of the photo-micrograph of FIG. 4, and the substrate was sectioned and prepared for the TEM photomicroscopy in similar fashion to the preparation of the semiconductor substrate 1 for the TEM photomicroscopy. The wafers from groups A and D of the substrate were fusion bonded at a bond anneal temperature of 1,150° C. The wafer A is indicated by the reference numeral 10, while the wafer D is indicated by the reference numeral 11. The bond interface is indicated by the reference numeral 5. As can be seen, an oxide island 12 is formed into the wafer 11 of group D which is the wafer which is super-saturated with oxygen. The wafer 10 of group A is free from oxide islands. Additionally, since the crystal plane orientation of the wafers A and D are different to each other, no stress fringes are visible in the photo-micrograph of FIG. 5. Stress fringes would be visible if interfacial stresses were present at the bond interface.

Figure 6:
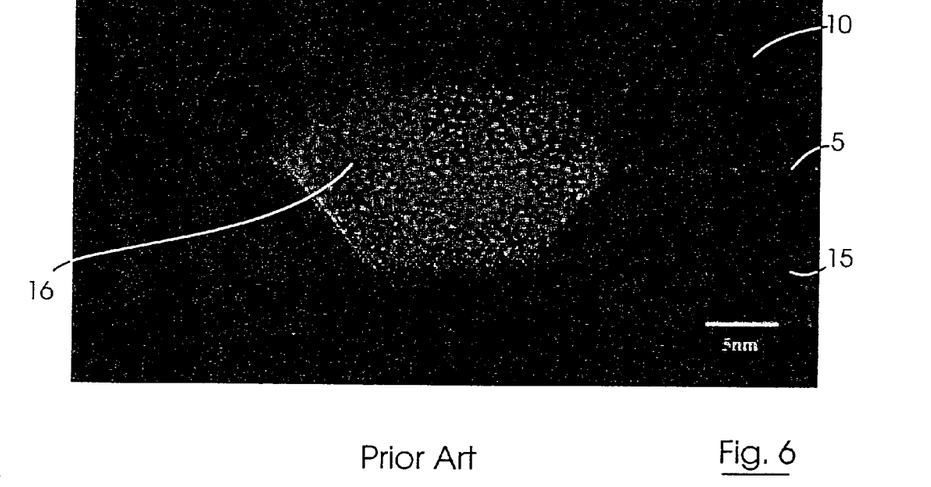
FIG. 6 is a photo-micrograph illustrating a cross-section of a portion of another semiconductor substrate not according to the invention.

FIG. 6 illustrates a photo-micrograph of substantially similar magnification to that of FIG. 5 of a semiconductor substrate formed from a wafer of group A and a wafer from group B. The wafer of group A is indicated by the reference numeral 10, while the wafer of group B is indicated by the reference numeral 15. The bond interface is indicated by the reference numeral 5. The wafers A and B of this substrate were fusion bonded at a bond anneal temperature of 1,150° C., and the substrate was prepared for the TEM photomicroscopy in similar fashion as the semiconductor substrate 1 was prepared. As can be seen, an oxide island 16 is formed partly in the wafer 15 of group B, and partly in the wafer 10 of group A. However, as can be seen, more of the oxide island 16 is formed in the wafer 15 of group B than in the wafer 10 of group A. This would be expected, since the wafer 15 of group B is super-saturated with oxygen, and thus incapable of absorbing any of the oxide from the oxide island 16, while the wafer 10 of group A appears to have absorbed some of the oxide from the oxide island 16. However, since the crystal plane orientation of the wafers A and B are different to each other, no stress fringes are visible in the photomicrograph of FIG. 6. Stress fringes would be visible if interfacial stresses were present at the bond interface.

Figure 7:
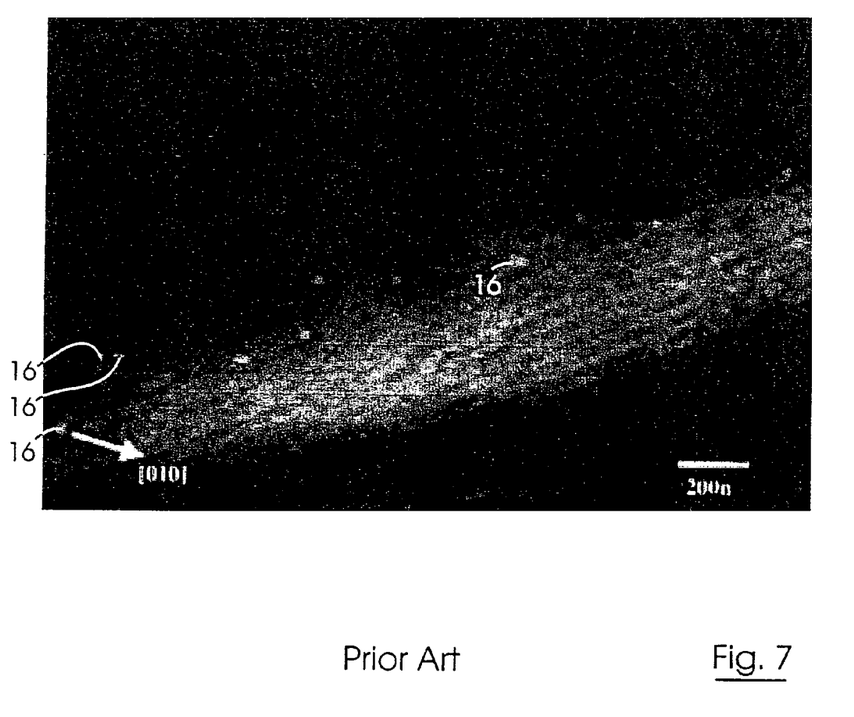
FIG. 7 is a photo-micrograph illustrating a portion of the semiconductor substrate of FIG. 6.

Referring now to FIG. 7, which illustrates a photo-micrograph at a magnification of 115,000× of a plan view of the semiconductor substrate formed from the wafer 10 of group A and the wafer 15 of group B already described with reference to FIG. 6. FIG. 7 illustrates the locations of the oxide islands 16 which appear as the white dots in the photo-micrograph. In the preparation of the semiconductor substrate for the plan view which was obtained by TEM photomicroscopy, the respective wafers A and B were ground and polished to a thickness of approximately 2 μm. The photo-micrograph was taken at an angle of 010 to the crystal plane of the wafer of group A.

Figure 8:
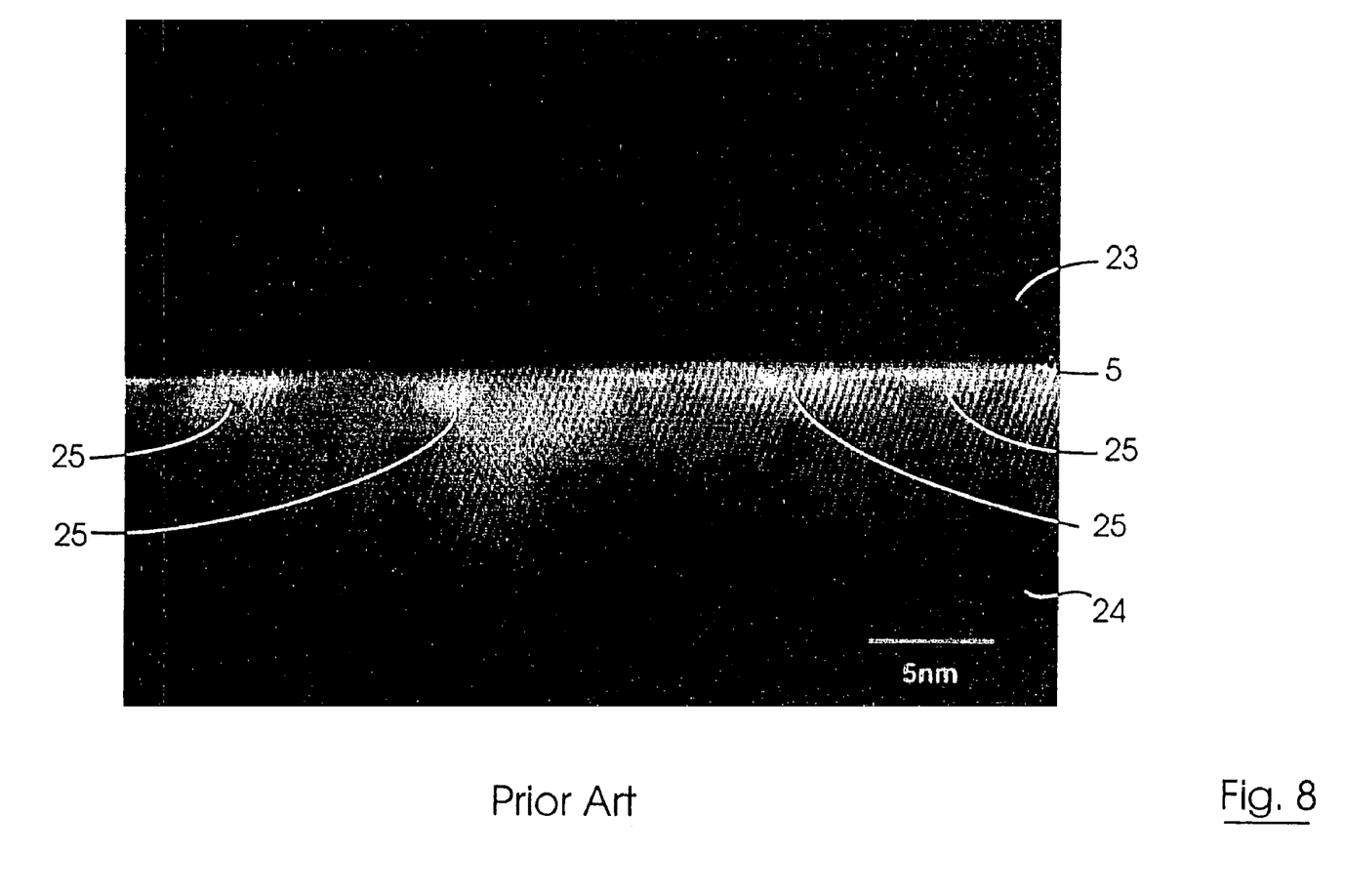
FIG. 8 is a photo-micrograph illustrating a cross-section of a portion of a further semiconductor substrate not according to the invention.

Referring now to FIG. 8, there is illustrated a photo-micrograph of a cross-section along a bond interface of a semiconductor substrate formed by two wafers of group A and thus both of <111> crystal plane orientation. The photo-micrograph is of similar magnification to that of the photo-micrograph of FIG. 4, and the semiconductor substrate was sectioned and prepared for the TEM photo-microscopy in similar fashion to the preparation of the semiconductor substrate 1. The two wafers of group A of the substrate were prepared as already described and were fusion bonded at a bond anneal temperature of 1,150° C. When abutting the bond faces 7 of the wafers of group A together, particular care was taken to ensure that the wafers were mechanically aligned as accurately as possible with their respective alignment edges 4 aligned. One of the wafers of group A is indicated by the reference numeral 23, and the other wafer of group A is indicated by the reference numeral 24. Since the two wafers of the semiconductor substrate are of group A and thus of float-zone silicon which is of low oxygen content, interfacial oxide or oxide islands along the bond interface 5 of the two wafers 23 and 24 are not visible, thus indicating that any native and other oxide formed on the bond faces of the wafers 23 and 24 prior to preliminary annealing of the two wafers was absorbed into the respective wafers through their bond faces during fusion bonding at the bond anneal temperature of 1,150° C. However, stress fringes which are represented by the transitions from light shading to dark shading in the wafer 24 along the bond interface 5 are clearly visible, thus indicating the presence of interfacial stresses along the bond interface 5. The light shading parts of the stress fringes are indicated by the reference numeral 25. It is believed that the cause of the interfacial stresses along the bond interface of the two wafers 23 and 24 of group A is due to the fact that while the wafers appeared to have been accurately mechanically aligned by their alignment edges 4, the interfacial atoms in the bond faces 7 of the respective wafers were not accurately aligned, and thus led to the interfacial stresses.

Figure 9:
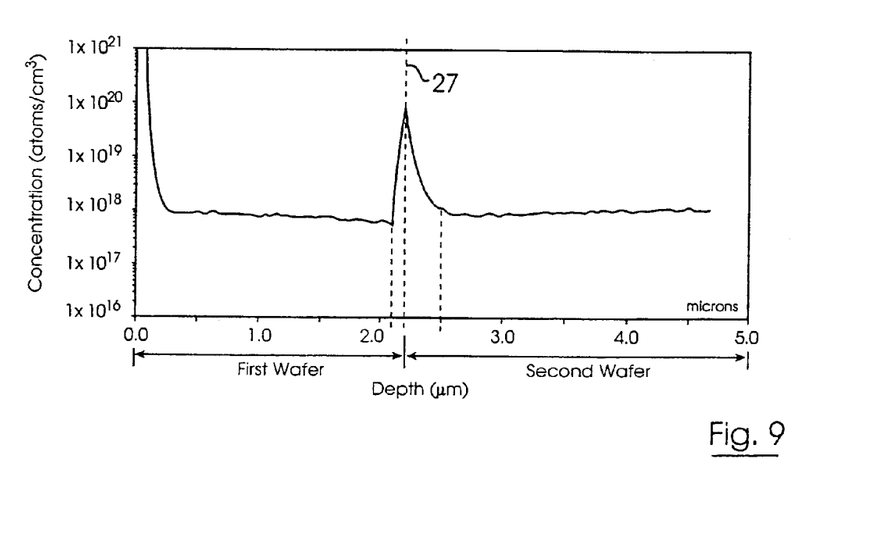
FIG. 9 is a graphical representation illustrating the concentration of oxygen through a cross-section of the semiconductor substrate of FIG. 1.

Referring now to FIG. 9, a graphical representation of the oxygen concentration across the interface 5 of the semiconductor substrate 1 prepared from the first and second wafers 2 and 3 described with reference to FIGS. 1 and 2 is illustrated. The oxygen content in atoms oxygen per $cm^3$ silicon is plotted on a log scale on the Y axis, while distance along a cross-section of the bond interface 5 of the first and second wafers 2 and 3 in microns is plotted on the X axis. The graph of FIG. 9 was obtained by high resolution secondary ion mass spectroscopy (SIMS). The first wafer 2 was ground and polished to a thickness of approximately 2 µm. The graph shows the oxygen content of the two wafers 2 and 3. As can be seen the oxygen content in the two wafers 2 and 3 is substantially constant with the exception of shallow depths on each side of the bond interface 5, which is represented by the broken line 27. The bond interface 5 occurs at approximately 2.2 µm along the X axis of the graph. The oxygen content of the first wafer 2 is high adjacent the bond face 7 of the first wafer 2 where the graph peaks, and falls off rapidly to the substantially constant oxygen content over a depth of approximately 0.1 µm. In the case of the second wafer 3 the oxygen content is high at the bond face 7 of the second wafer 3 and falls off relatively rapidly over a depth of approximately 0.3 µm to the substantially constant oxygen content. This, thus, shows that the oxygen from the interfacial oxide islands and any other interfacial oxide has been absorbed into the respective first and second wafers 2 and 3 through their bond faces 7 and is absorbed into the respective first and second wafers 2 and 3 adjacent their bond faces 7. Although, the oxygen content of the first and second wafers 2 and 3 are $1\times10^{16}$ atoms oxygen per $cm^3$ silicon, it appears from the graph of FIG. 9 that the oxygen content of the first and second wafers 2 and 3 is of the order $1\times10^{18}$ atoms oxygen per $cm^3$ silicon. The reason for this is that the reading of oxygen content by the SIMS also includes other background oxygen, and the actual values provided by the graph are indicative of relative values, rather than actual values.

Similar TEM and SIMS inspections of substrates formed from the combinations of wafers of the other groups, which were fusion bonded at the anneal temperature of 1,150° C. were carried out. The substrates formed by the wafers of groups A and C and the substrates formed by wafers of groups A and F all showed the existence of oxide islands at the bond interface after fusion bonding had been completed. Similar inspections have also revealed oxide islands existing at the bond interface of the substrates formed from wafers of groups A and B, groups A and C, groups A and D and groups A and F at the anneal temperatures of 1,000° C., 1,105° C., 1,100° C. and 1,200° C. after fusion bonding had been completed.

However, similar TEM and SIMS inspections have indicated that the optimum results when the wafers of groups A and E are combined are achieved at anneal fusion bond temperatures at or above 1,000° C. It is believed that at the higher anneal fusion bond temperatures the oxygen from the native oxide, which is absorbed into the wafers is diffused to a greater depth within the wafer, and thus more evenly diffused in the wafer. Particularly good results were achieved with the bond anneal temperature of 1,150° C. However, it will be readily apparent to those skilled in the art that the upper bond anneal temperature will be limited by the melting point of the silicon material of the wafers. Although, in general, it is envisaged that the wafers could be fusion bonded at anneal temperatures of up to the order of 1,250° C., which should give particularly good results.

In the semiconductor substrates which were prepared from pairs of wafers of group A, no interfacial oxide was found in semiconductor substrates fusion bonded at temperatures greater than 1,000° C. for 180 minutes. However, interfacial stresses were present in all the semiconductor substrates.

Figure 10:
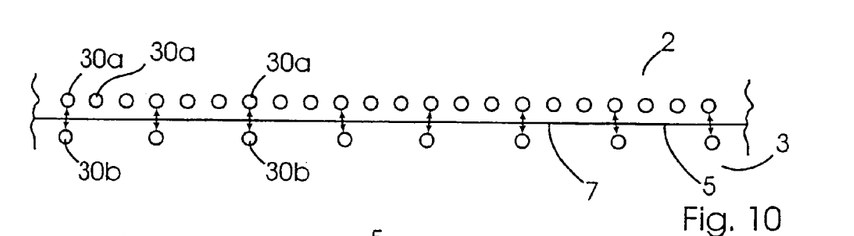
FIG. 10 is a diagrammatic representation of a portion of the semiconductor substrate of FIG. 1.
Figure 11:
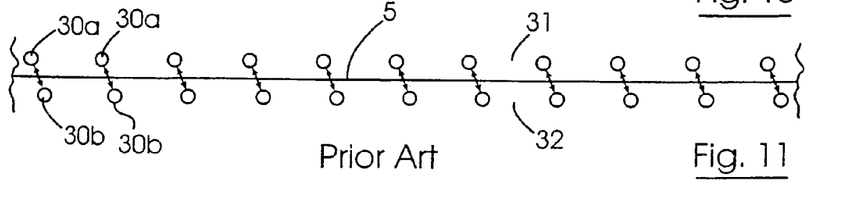
FIG. 11 is a diagrammatic representation similar to the diagrammatic representation of FIG. 10 of a portion of a semiconductor substrate not according to the invention.

Referring now in particular to FIGS. 10 and 11, an explanation of how it is believed the method according to the invention minimises interfacial stresses along the bond interface 5 of the substrate 1 of FIGS. 1 and 2. FIG. 10 is a diagrammatic representation of facial atoms 30 at the bond faces 7 of the first and second wafers 2 and 3 at the bond interface 5. The facial atoms 30 along the bond face 7 of the first wafer 2 are indicated by the reference numeral 30a, while those of the second wafer 3 are indicated by the reference numeral 30b. As can be seen, since the first wafer 2 is of <111> crystal plane orientation, the facial atoms 30a of the first wafer 2 are closer together than the facial atoms 30b of the second wafer 3 which is of <100> crystal plane orientation. It is believed that because of the fact that the spacing between the respective facial atoms 30a and 30b at the bond faces 7 of the respective first and second wafers 2 and 3 is different that each atom 30b of the second wafer 3 pairs with the closest atom 30a of the first wafer 2, thus leaving the remaining facial atoms 30a at the bond face 7 of the first wafer 2 free. This, it is believed, minimises interfacial stresses along the bond interface 5. It is also possible that where an atom 30b in the second wafer 3 is not provided with a matching atom 30a in the first wafer 2, which is sufficiently close, an attractive force will be set up between the atom 30b of the second wafer 3 and the nearest atom 30a in the first wafer 2. However, it is envisaged that the attractive forces between such atoms 30a and 30b will be in various different directions, thus tending to minimise interfacial stresses along the silicon/silicon bond interface 5.

Referring now in particular to FIG. 11, a diagrammatic representation of the facial atoms in wafers 31 and 32 of a substrate in which the wafers were of similar crystal plane orientation, as for example, the substrates prepared by pairs of wafers selected from the groups A and C. The facial atoms 30 at the bond faces 7 of the wafers 31 and 32 are indicated by the reference numerals 30a and 30b. The wafers 30 and 31 are illustrated slightly misaligned, and as can be seen, the facial atoms 30a and 30b are slightly offset from on another. Thus, attractive forces set up between adjacent atoms 30a and 30b in the respective wafers 31 and 32 are set up at an angle inclined to the bond interface 5, all of which act in similar directions, thus inducing the interfacial stresses.

Figure 12:
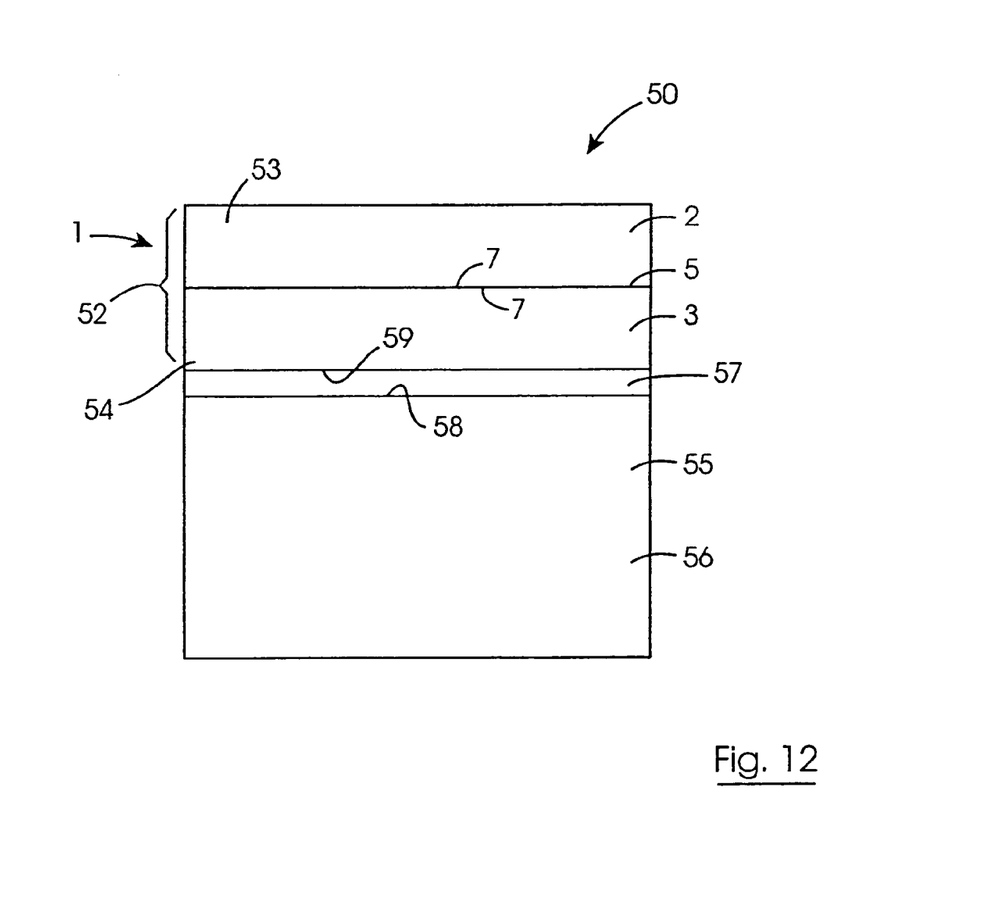
FIG. 12 is a transverse cross-sectional elevational view of a semiconductor on insulator structure also according to the invention.

Referring now to FIG. 12, there is illustrated a semiconductor on insulator structure, in this case a silicon on insulator (SOI) structure indicated generally by the reference numeral 50. The SOI structure 50 is particularly suitable for use as a substrate in which integrated circuits are to be fabricated, and in particular, as a substrate in which integrated circuits comprising CMOS devices, bipolar devices, PIN diodes, insulated gate bipolar transistors, and other such devices are to be fabricated. Indeed, the SOI structure 50 is also suitable for use as a substrate in which micro-mechanical components such as micro-mirrors or micro-electromechanical components are to be formed. Indeed, the SOI structure 50 is particularly suitable for use as a substrate in which integrated circuits are to be fabricated as well as micro-mechanical or micro-electromechanical components. The SOI structure 50 comprises a substrate layer 52 in which the integrated circuit or circuits and micro-mechanical or micro-electromechanical components may be fabricated. The substrate layer 52 is a composite layer formed from a first wafer 53 and a second wafer 54 as will be described below, and is supported on a handle layer 55 formed from a third wafer 56. A buried electrically insulating layer 57 is located between the substrate layer 52 and the handle layer 55.

The third wafer 56 forming the handle layer 55 is selected from a silicon wafer of single crystal silicon, which may be of any desired depth, and typically, would be selected from a wafer of depth in the range of 300 µm to 1,000 µm. The oxygen content or the crystal plane orientation of the wafer 56 of the handle layer 55 is not important. The buried insulating layer 57 is provided by a buried oxide layer, which in this embodiment of the invention, is thermally grown on an insulating layer abutting face 58 of the handle layer 55, and is bonded to an insulating layer abutting face 59 of the second wafer 54 as will also be described below.

The substrate layer 52 is formed from the semiconductor substrate 1 of FIGS. 1 and 2, and similar components are identified by the same reference numerals. The first wafer 53 is provided by the first wafer 2 of the semiconductor substrate 1, and the second wafer 54 is provided by the second wafer 3 of the substrate 1, and are fusion bonded at the anneal temperature of 1,150° C.

The SOI structure 50 is prepared as follows. The insulating layer abutting face 58 of the third wafer 56 which forms the handle layer 55 is polished and cleaned. After polishing and cleaning, the oxide layer which forms the insulating layer 57 is thermally grown on the insulating layer abutting face 58 to a desired depth. The grown oxide layer may be machined to the desired depth after growing in order to present a smooth surface to the insulating layer abutting face 59 of the second wafer 54. After the first and second wafers 2 and 3 have been fusion bonded to form the semiconductor substrate 1, the first and second wafers 2 and 3 are ground to the desired depths to form the substrate layer 52. The insulating layer abutting face 59 of the second wafer 54 is polished and cleaned. The insulating layer abutting face 59 of the second wafer 54 of the substrate layer 52 is abutted with the insulating layer 57, and the substrate layer 52 is bonded to the insulating layer 57 by high temperature anneal bonding. In this embodiment of the invention the anneal bonding is carried out at a temperature in the range of 1,000° C. to 1,200° C. for a time period of the order of sixty to one hundred and eighty minutes. The handle layer 55 may be ground to a desired depth at this stage, or may be ground subsequently. If further grinding of the first wafer 53 is required, this can similarly be carried out at this stage. Otherwise, the SOI structure 50 is ready for use and integrated circuits comprising electronic devices and/or micro-mechanical or micro-electromechanical components can be fabricated in the substrate layer 52.

The advantage of forming the SOI structure 50 with the substrate layer 52 formed from the semiconductor substrate 1 are many. The SOI structure according to the invention gives a higher quality structure than would otherwise be provided if the layer formed by the first wafer 2 had been formed by an epitaxy layer in an epi deposition step. Furthermore, subsequent processing of the SOI structure is not limited by epitaxy process restrictions on dopants and crystal orientation, and therefore the costly steps of depositing epitaxial layers which are required for the fabrication of semiconductor devices are avoided. In particular, the SOI structure 50 according to the invention provides two single crystal silicon layers of different material composition, and the first and second wafers can be selected to be of different resistivities, for facilitating the fabrication of semiconductor devices. In addition, the SOI structure 50 allows integration of devices on a single substrate for electronic applications, for example, insulated gate bipolar transistors may be formed in the substrate layer 52 with photodetectors, pressure sensors, optical switches and the like.

A further advantage of the provision of the SOI structure 50 according to the invention is that since the substrate layer 52 is formed by bonding two single crystal silicon wafers, the substrate layer is less prone to thickness variation, than if it were grown by epitaxy, particularly with thicknesses above 10 µm.

While the SOI structure 50 has been described with the semiconductor substrate layer 52 being formed by the semiconductor substrate 1 of FIGS. 1 and 2, it is envisaged that the substrate layer 52 may be formed by any other two suitable wafers of single crystal silicon bonded together. For example, while it is desirable that the wafers forming the substrate layer 52 should be of low oxygen content in order to minimise interfacial oxide at the bond interface 5, if the presence of some interfacial oxide were acceptable, the wafers forming the substrate layer 52 may be of relatively high oxygen content. Additionally, if the minimisation of interfacial stresses along the bond interface 5 were not required, the wafers forming the substrate layer 52 could each be provided with wafers of the same crystal plane orientation. Indeed, it is envisaged in certain embodiments of the SOI structure according to the invention, other suitable semiconductor wafers besides the silicon wafers described may be used in the preparation of the substrate layer 52.

Needless to say, other suitable buried insulating layers may be provided, as may other suitable handle layers besides those described. Where the insulating layer is provided as an oxide layer, it may be formed by any other suitable process besides thermal growing, for example, the insulating layer may be a deposited oxide layer. It will also be appreciated that the insulating layer may be formed on the second wafer of the substrate layer 52 and bonded to the handle layer. Alternatively, it is envisaged that the insulating layer may be formed on both the handle layer and the second wafer of the substrate layer, and the substrate layer would be bonded to the handle layer by bonding the two oxide layers together.

Furthermore, it will be appreciated that the substrate layer of the SOI structure 50 may be formed by more than two wafers, for example, three or four wafers, each of which would be directly bonded to its adjacent wafer. Where interfacial oxide is to be minimised between adjacent pairs of wafers, the wafers would be selected to be of relatively low oxygen content, and where minimisation of interfacial stresses at the bond interface between adjacent pairs of wafers is required, the wafers would be selected to be of different crystal plane orientation.

While the bonding of the buried insulating layer to the substrate layer of the SOI structure has been described as being bonded by a high temperature bond anneal, any other suitable bonding process for bonding an insulating layer to a semiconductor layer may be used. Needless to say, the bonding process will be appropriate to the material of the buried oxide layer and the semiconductor material of the substrate layer of the SOI structure 50.

It is also envisaged that the semiconductor substrate of FIGS. 1 and 2 may be prepared with silicon wafers of similar crystal plane orientation if and only minimisation of interfacial oxide were required, and minimisation of interfacial stresses at the bond interface were not required. It is also envisaged that the semiconductor substrate of FIGS. 1 and 2 may be prepared with wafers of higher oxygen content than that described if only minimisation of interfacial stresses were required, and minimisation of interfacial oxide at the bond interface were not required.

While the wafers of the semiconductor substrate of FIGS. 1 and 2 have been described as being of a specific oxygen content, it is envisaged that the oxygen content of the wafers may be higher or lower than that described, however, in order to minimise interfacial oxide at the bond interface, it is preferable that the oxygen content of the wafers should be as low as feasible, and preferably, the wafers should be of oxygen content significantly less than the limit of solid solubility of oxygen in the silicon at the bond anneal temperature at least of the relevant wafers. Additionally, while the wafers of the semiconductor substrate of FIGS. 1 and 2 have been described as being of similar oxygen content, it is envisaged that the oxygen content of the respective wafers may be dissimilar.

Needless to say, where minimisation of interfacial stresses at the bond interface of the wafers of the semiconductor substrate of FIGS. 1 and 2 is required, it is important that the wafers of the semiconductor substrate be of different crystal plane orientation, however, the wafers may be of crystal plane orientations other than those described.

Additionally, while the semiconductor substrate of FIGS. 1 and 2 have been described as being mechanically aligned by mechanically aligning the edges 4 of the respective wafers, while this is preferable, it is not essential, particularly where the crystal plane orientation of the respective wafers is different.

While the wafers of the semiconductor substrate of FIGS. 1 and 2 have been described as being bonded by fusion bonding, any other suitable bonding process, for example, plasma bonding, may be used. It is also envisaged that the preliminary anneal to which the first and second wafers of the semiconductor substrate of FIGS. 1 and 2 are subjected may be eliminated, particularly if the wafers were to be fusion bonded at the bond anneal temperature within a relatively short time period of being polished, cleaned dried and abutted together.

Additionally, while the fusion bonding has been described at specific temperatures and for specific time periods, the fusion bonding of the wafers of the semiconductor substrate of FIGS. 1 and 2 may be carried out at other suitable bond anneal temperatures and for other suitable time durations. Indeed, bond anneal temperatures as low as 900° C. may be adequate in certain cases.

It is also envisaged that semiconductor substrates according to the invention may be prepared from more than two wafers, and where interfacial oxide between the bond interfaces of the respective pairs of wafers is to be minimised, the wafers forming the semiconductor substrate would be selected to be of low oxygen content, and where interfacial stresses along the bond interfaces of the respective pairs of wafers is to be minimised, the wafers would be selected so that the crystal plane orientations of the respective wafers would be different. Needless to say, where both interfacial oxide and interfacial stresses along the bond interfaces are to be minimised, the respective wafers of the semiconductor substrate would be selected to be of relatively low oxygen content and of different crystal plane orientations.

While the semiconductor substrate 1 has been described as being prepared from wafers of relatively specific electrical resistivity, it will be readily apparent to those skilled in the art that the wafers of the semiconductor substrate may be of any desired electrical resistivities. Indeed, in certain cases, the electrical resistivity of the respective wafers of the semiconductor substrate may be similar, although, in general, the electrical resistivities of the respective wafers of the semiconductor substrate will be different to each other, and may be significantly different to each other, depending on the devices or components to be subsequently formed in the semiconductor substrate. Where the devices are semiconductor devices, depending on the semiconductor devices, the electrical resistivity of the respective wafers may be significantly different to each other.

It is also envisaged that only of the first and second wafers of the composite layer of the SOI structure of FIG. 12 may be of silicon

The invention claimed is:

1. A method for preparing a semiconductor on insulator structure comprising the following steps in any order:
   directly bonding a first wafer of silicon material to a second wafer of silicon material along a bond interface defined by abutting bond faces of the respective wafers, the first and second wafers being selected so that the number of atoms per unit surface area at the bond face of the first wafer is different to the number of atoms per unit surface area at the bond face of the second wafer,
   forming an electrically insulating layer on at least one of an insulating layer abutting face of the second wafer opposite the bond face thereof and an insulating layer abutting face of a third wafer of semiconductor material, and
   bonding the second and third wafers with the insulating layer located therebetween.

2. A method as claimed in claim 1 in which the first and second wafers are bonded prior to bonding of the second and third wafers.

3. A method as claimed in claim 1 in which the insulating layer is formed on the insulating layer abutting face of the third wafer, and the second wafer is bonded to the insulating layer with the insulating layer abutting face of the second wafer abutting the insulating layer.

4. A method as claimed in claim 1 in which the insulating layer is a grown layer.

5. A method as claimed in claim 1 in which the insulating layer is an oxide layer.

6. A method as claimed in claim 1 in which the second and third wafers with the insulating layer located therebetween are fusion bonded by bond annealing at a bond anneal temperature in the range of 900° C. to 1,250° C.

7. A method as claimed in claim 1 in which the first and second wafers are fusion bonded at a bond anneal temperature of at least 900° C.

8. A method as claimed in claim 7 in which the first and second wafers are subjected to the bond anneal temperature for fusion bonding for a bonding period of at least 30 minutes.

9. A method as claimed in claim 1 in which the electrical resistivities of the respective first and second wafers are different.

10. A method as claimed in claim 1 in which the bond faces of the respective first and second wafers define respective crystal planes, and the first and second wafers are selected so that the crystal plane defined by the bond face of one of the first and second wafers is oriented at an angle which is different to the angle of the crystal plane defined by the bond face of the other of the first and second wafers, so that the number of atoms per unit surface area at the bond faces of the respective first and second wafers are different.

11. A method as claimed in claim 1 in which one of the first and second wafers is selected from one of the following wafer types, and the other of the first and second wafers is selected from another one of the following wafer types:

<111> crystal plane orientation wafer,

<100> crystal plane orientation wafer and

<110> crystal plane orientation wafer.

12. A method as claimed in claim 1 in which the first and second wafers are provided with respective alignment edges, and the first and second wafers are aligned with their respective alignment edges in alignment for bonding thereof.

* * * * *